(12) United States Patent
Boyd

(10) Patent No.: US 9,246,315 B2
(45) Date of Patent: Jan. 26, 2016

(54) SEALS TO BARRIER PENETRATIONS

(75) Inventor: Michael David Boyd, St Kilda West (AU)

(73) Assignee: CABSCAPE HOLDINGS PTY LTD., Footscray, Victoria (AU)

( * ) Notice: Subject to any disclaimer, the term of this patent is extended or adjusted under 35 U.S.C. 154(b) by 242 days.

(21) Appl. No.: 13/977,826

(22) PCT Filed: Dec. 23, 2011

(86) PCT No.: PCT/AU2011/001688
§ 371 (c)(1),
(2), (4) Date: Aug. 5, 2013

(87) PCT Pub. No.: WO2012/088565
PCT Pub. Date: Jul. 5, 2012

(65) Prior Publication Data
US 2013/0307225 A1 Nov. 21, 2013

(30) Foreign Application Priority Data
Jan. 1, 2011 (AU) .............................. 2011900007

(51) Int. Cl.
*H05K 5/00* (2006.01)
*H02G 3/02* (2006.01)
*F16L 5/04* (2006.01)
*H02G 3/18* (2006.01)
*H05K 5/06* (2006.01)

(52) U.S. Cl.
CPC .. *H02G 3/02* (2013.01); *F16L 5/04* (2013.01); *H02G 3/185* (2013.01); *H05K 5/069* (2013.01)

(58) Field of Classification Search
USPC .................................. 174/152 G, 153 G, 659
See application file for complete search history.

(56) References Cited

U.S. PATENT DOCUMENTS

| 4,520,976 | A | * | 6/1985 | Cournoyer et al. ............. 248/56 |
| 6,314,692 | B1 | | 11/2001 | Munzenberger et al. |
| 6,462,277 | B1 | * | 10/2002 | Young et al. .................... 174/66 |
| 6,632,999 | B2 | | 10/2003 | Sempliner et al. |
| 7,282,650 | B2 | | 10/2007 | Czuhanich |
| D571,641 | S | * | 6/2008 | Sempliner et al. ............. D8/356 |
| 7,507,912 | B1 | | 3/2009 | Sempliner |
| 7,544,901 | B2 | | 6/2009 | Ehmann |
| 7,723,622 | B2 | | 5/2010 | Dukes |

FOREIGN PATENT DOCUMENTS

WO WO 2005/095545 10/2005

* cited by examiner

*Primary Examiner* — Dhirubhai R Patel
(74) *Attorney, Agent, or Firm* — Stinson Leonard Street LLP

(57) ABSTRACT

A number of devices (floor grommets) for providing an air seal of an aperture through which one or more cables or conduits pass are disclosed. The devices (1, 90) include a frame (6) and at least first and second opposing sealing members (91, 92) defining sealing faces mounted in the frame. At least one of the sealing members (91, 92) is movable between a position in which the aperture is substantially closed and a position in which the aperture is substantially open. The sealing members (91, 92) includes resilient flexible compressible foamed plastics or polymeric material or the like. The sealing members provide a substantial air seal across the frame opening in use with said resilient flexible compressible foamed plastics or polymeric material forming the sealing members deforming and conforming around any cables or conduits or the like extending through the frame.

13 Claims, 7 Drawing Sheets

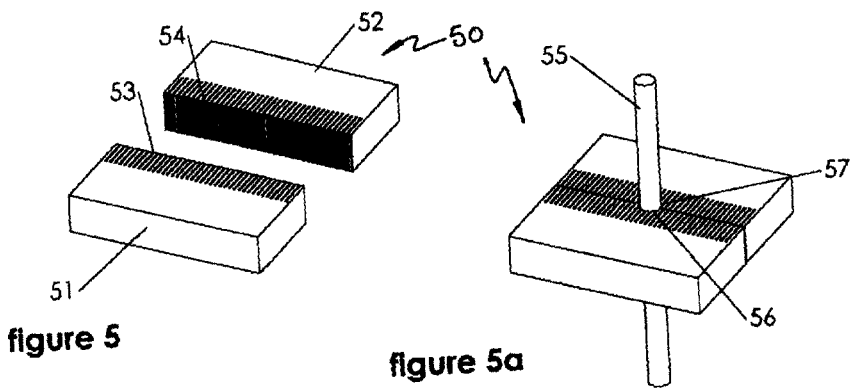
figure 5
figure 5a
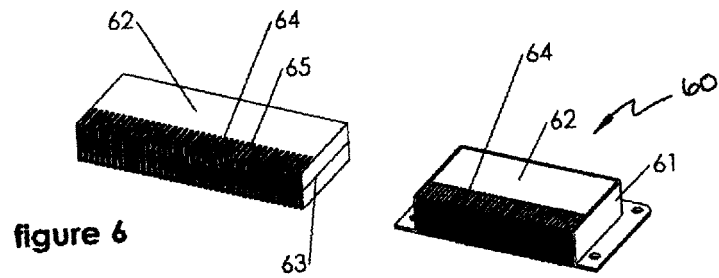
figure 6
figure 6a
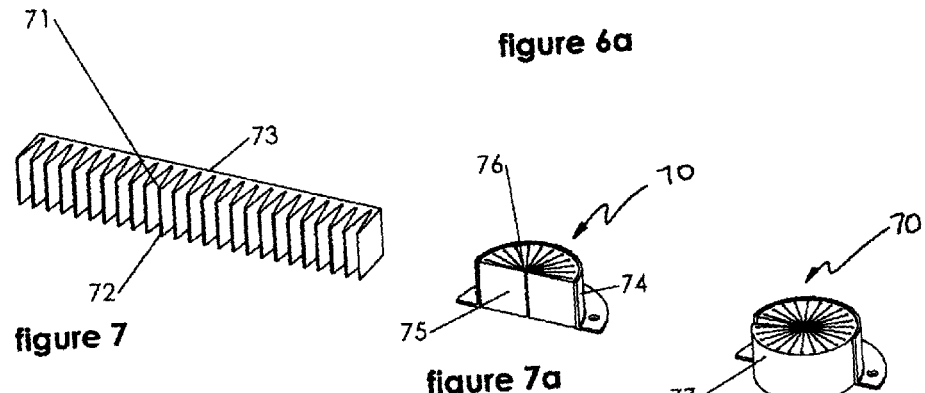
figure 7
figure 7a
figure 7b
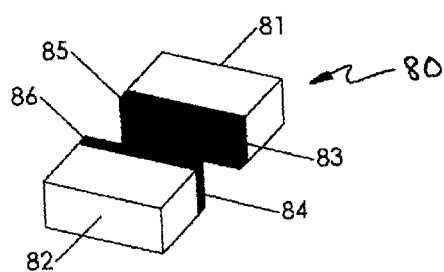
figure 8

SEALS TO BARRIER PENETRATIONS

CROSS REFERENCE TO RELATED APPLICATIONS

This application claims priority from Australian provisional application No 20119000007 dated 1 Jan. 2011, the entire contents of which are incorporated herein by reference.

FIELD OF THE INVENTION

This invention relates to a seal for sealing around cables or similar conduits transiting through an aperture/penetration in a floor, wall, ceiling or the like. It is particularly suited to applications where conduits and cables passing through the aperture are of varying sizes and numbers, and subject to periodic insertion and/or removal.

BACKGROUND OF THE INVENTION

Modern data centres typically house multiple rows of equipment cabinets standing on a raised access floor that serves as a pressurised air plenum to deliver cooling air to the computer equipment. The cabinet rows face onto "cold aisles" fed with cooling air from floor-mounted air grilles, and this is drawn through the equipment racks and discharged into "hot aisles" at the rear of the cabinet rows, where it is re-circulated via the computer room air conditioning plant.

Much of the cabling to the equipment racks is fed from the sub-floor space through holes in the floor deck/sub-floor. Cables are regularly added and removed, so large holes are required to provide ready accessibility, but these can leak substantial quantities of cooling air which will bypass the equipment racks and reduce cooling efficiency. To address this problem, seals have been developed that can be easily removed and replaced and which substantially reduce air leakage and thus increase the quantity of air delivered into the cold aisles. Such seals however offer virtually no resistance to fire. Whilst there are currently available fire-resistant seals, these are rigid and unadaptable to different sizes and numbers of cables, and are thus unsuited to applications where regular wiring changes are required.

Fire in data centres is a serious issue. The high rate of air flow in the sub-floor plenum will fan the development and spread of fire, which can then pass via floor penetrations into the equipment racks, with potentially catastrophic consequences.

To address this risk data centres are fitted with very early smoke detection apparatus, and rapidly deployable fire suppression systems in the form of water sprinklers and/or gas flooding systems. To be effective, the fire detection and suppression systems are set to activate at the first possible indication of a fire, and this creates an alternate risk of a false alarm which will unnecessarily activate the fire suppression and shut down the data centre; which is in itself a disruptive and costly event.

A further risk to electronic equipment comes from airborne particulates, which may include zinc whiskers detaching from sub-floor structure, but also corrosive decomposition products resulting from fire, and accordingly a more effective barrier to air flow would also assist in reducing such hazards.

While the prior art addresses some of the issues, none are entirely satisfactory. Sempliner U.S. Pat. No. 6,632,999 discloses brush-seal devices in which multiple layers of opposing brushes spread around the cables from opposite sides of the grommet frame and thus shroud the opening. The seals are designed for easy removal and replacement to allow changes to cabling, and the seals are adaptable to different sizes and numbers of cables, however if the transiting cables pull sideways against the brushes the seal can open up and lose effectiveness.

U.S. Pat. No. 7,507,912, also to Sempliner, addresses issues of air leakage, electrostatic build-up and adaptability. Although mention is made of flame-retardant materials and alternative sealing elements made from flexible materials such as foam, there is no disclosure of practicable means to utilise such materials to achieve dust or water tightness, or fire resistance.

U.S. Pat. Nos. 7,544,901, 7,282,650 and 7,723,622 describe closures with more effective sealing capability, but these devices generally require the seal face to be profiled to suit a pre-determined conduit diameter, and so they are unadaptable to different conduit sizes and numbers. They also require effort to install and remove and so are unsuited to situations of constant cabling changes, particularly in confined spaces such as on the floor of equipment cabinets.

Any discussion of documents, acts, materials, devices, articles or the like which has been included in the present specification is not to be taken as an admission that any or all of these matters form part of the prior art base or were common general knowledge in the field relevant to the present invention as it existed before the priority date of each claim of this application.

SUMMARY OF THE INVENTION

In general there is provided a plurality of opposing seal segments meeting at a seal interface, at least one segment being movable from a position of engagement with the opposing seal to a position in which said penetration is relatively unobstructed by it, and in which each seal segment has a plurality of surfaces that form a compound seal against a region of an opposing seal element and also against conduit passing through said penetration so as to provide a continuous seal between both conduit and barrier, said seal being adaptable to conduit of varying sizes and numbers.

According to a first aspect of the present invention there is provided a device for providing an air seal or partial air seal of an aperture through which one or more cables or conduits or the like pass, the device comprising:

at least first and second opposing sealing members, the first sealing member defining a first sealing face and the second sealing member defining a second sealing face opposing the first sealing face, at least one of the sealing members being movable between a position in which the aperture is substantially closed and a position in which the aperture is substantially open;

wherein the sealing members comprise a resilient flexible compressible foamed plastics or polymeric material or the like; and wherein the first sealing face defines at least one elongate recess extending along the face having at least one side wall and wherein the second sealing face defines a protrusion in the form of a tongue having side faces arranged to locate in the recess when the first and second sealing faces are engaged together, the arrangement being such that the sealing members provide a substantial air seal across the frame opening in use with at least one side face of the tongue abutting and overlapping the at least one side wall of the recess said resilient flexible compressible foamed plastics or polymeric material forming the sealing members deforming and conforming around any cables or conduits or the like extending through the frame.

Advantageously, the device provides a seal wherein the side faces of the tongues and grooves (parallel to the plane of the aperture and perpendicular to the axis of the cables passing through the aperture) are substantially co-planar and overlap even when the sealing members are not fully closed providing an effective convoluted seal. This feature combined with the resilience and compressibility of the foam provides a much improved seal. It is to be noted that the mating surfaces of the opposing sealing members are essentially planar/flat. That is to say there need be no pre-defined cut-outs required to suit particular cable or conduit arrays and the seals deform and conform where necessary to the array of cables/conduits passing through the aperture. However, in some embodiments, cut-outs may be provided.

Typically the sealing members are mounted in a frame for lining the aperture having a frame opening in which the two opposing sealing members are mounted;

The recess may be in the form of a channel between two tongues.

Alternatively, the recess may be an edge recess.

In one embodiment the protrusion defines a first surface facing the first sealing member which is planar and which is substantially free from pre-formed recesses for receiving cables or the like.

However, in alternative embodiments one or more cut-outs shaped to receive a conduit or the like may be provided.

Typically, the first sealing face in which the recess is located, defines two substantially co-planar surfaces, the surfaces being located on either side of the recess and being substantially free from pre-formed recesses for receiving cables or the like.

Preferably, the second sealing face defines a second protrusion which defines a second surface facing the first sealing member which is co-planar with the first surface and an edge recess is defined in the first sealing face opposing the second protrusion for receiving the second protrusion when the first and second sealing faces are engaged together.

A related aspect of the invention provides a device for providing a seal or partial seal of an aperture through which one or more cables or conduits or the like pass, the device comprising:

at least first and second opposing sealing members, the first sealing member defining a first sealing face and the second sealing member defining a second sealing face opposing the first sealing face, at least one of the sealing members being movable between a position in which the aperture is substantially closed and a position in which the aperture is substantially open;

wherein the first sealing member comprises a plurality of contiguous fingers of a resilient flexible compressible foamed plastics or polymeric material or the like extending towards the second sealing member and wherein the second sealing member comprises a plurality of fingers of a resilient flexible compressible foamed plastics or polymeric material or the like extending towards the first sealing member;

the arrangement being such that the sealing members provide a substantial air seal across the aperture in use with the fingers deflecting and/or deforming and conforming around any cables or conduits or the like extending through the aperture.

Typically the sealing members are mounted in a frame for lining the aperture having a frame opening in which the two opposing sealing members are mounted;

Typically, the fingers define an end face and parallel side faces and both the end faces and the side faces seal against any cables or conduits or the like extending through the frame.

The fingers of each sealing member may have a rectangular constant cross-section and extend from a single piece of foamed plastics or polymeric material.

In one embodiment, the end faces of the fingers define an array of filaments in a brush-like array.

Preferably, the filaments are non-combustible.

Preferably, the filaments are electrically conductive.

The foamed plastics or polymeric material may include a fire-retardant.

Preferably, the foamed plastics or polymeric material includes a component (which may be a mixture or combination of compounds) that transforms into a ceramic material at a temperature above an activation temperature.

In a preferred embodiment, the foamed plastics or polymeric material includes a component that expands/intumesces at a temperature above an activation temperature. The component may be exfoliating graphite.

Typically, the foamed plastics or polymeric material includes an electrically conductive material.

For some applications, for example for sound deadening, the foamed plastics or polymeric material includes a additive to increase the density of the material such as Barium Sulphate.

The sealing members may define an upper surface which is generally perpendicular to the surface at which the sealing elements engage and which have a relatively thicker skin than the sealing faces of the opposing sealing members.

The foamed plastic or polymeric material may comprises a foamed polyurethane, ethylene propylene diene monomer (epdm) or silicone.

The frame may be circular in plan view or in an alternative embodiment may be rectangular in plan view.

Typically each sealing element defines three perimeter edges which abut the frame and the perimeter edges define a projection which engages against the interior of the frame and presses the sealing members against the frame.

In one embodiment, the frame may define spring loaded clamps for attaching the frame to an aperture in a floor, sub-floor, wall ceiling or the like.

Alternatively, toggle screws may be used to secure the frame in a sub-floor, or other barrier.

In a further embodiment, the invention provides a device for providing a gas or air seal or partial gas/air seal of an aperture through which one or more cables or conduits or the like pass, the device comprising:

a first pair of sealing elements comprising at least first and second opposing sealing members, the first sealing member defining a first sealing face and the second sealing member defining a second sealing face opposing the first sealing face, at least one of the sealing members being movable between a position in which the aperture is substantially closed and a position in which the aperture is substantially open;

wherein the sealing members comprise a resilient flexible compressible foamed plastics or polymeric material or the like; and a frame for lining the aperture having a frame opening in which the two opposing sealing members are mounted; and a second pair of opposed sealing elements each element comprising a plurality of filamentary elements anchored in a cantilever fashion from the frame and extending into the frame opening to form a second seal to resist the flow of air through the frame opening;

the arrangement being such that the sealing members and elements provide a substantial air seal across the frame opening in use with said resilient flexible compressible foamed plastics or polymeric material forming the sealing members deforming and conforming around any cables or conduits or the like extending through the frame.

BRIEF DESCRIPTION OF THE DRAWINGS

Specific embodiments of the invention will now be described by way of example only and with reference to the accompanying drawings in which:—

FIG. 5 is an exploded view of a compressible foam seal in which each segment has a linear array of fingers extending between front and rear faces and across the closure plane to the seal interface;

FIG. 5a shows the same seal in the closed position and encapsulating a conduit;

FIG. 6 shows a development of the seal segment as depicted in FIG. 5 illustrating a possible manufacturing process;

FIG. 6a shows the seal segment in FIG. 6 fitted into a segment of a grommet frame;

FIG. 7 shows a compressible foam seal segment designed to fit into a cylindrical penetration;

FIG. 7a shows the seal segment depicted in FIG. 7 fitted into a segment of a cylindrical grommet frame;

FIG. 7b shows an alternative arrangement in which one or more single seal segments of the type shown in FIG. 7 is (or are) curled through 360 degrees;

FIG. 8 is an exploded view of a compressible foam seal in which the seal segments incorporate filamentary brush seals on each seal face;

DETAILED DESCRIPTION OF PREFERRED EMBODIMENTS

Figure 1:
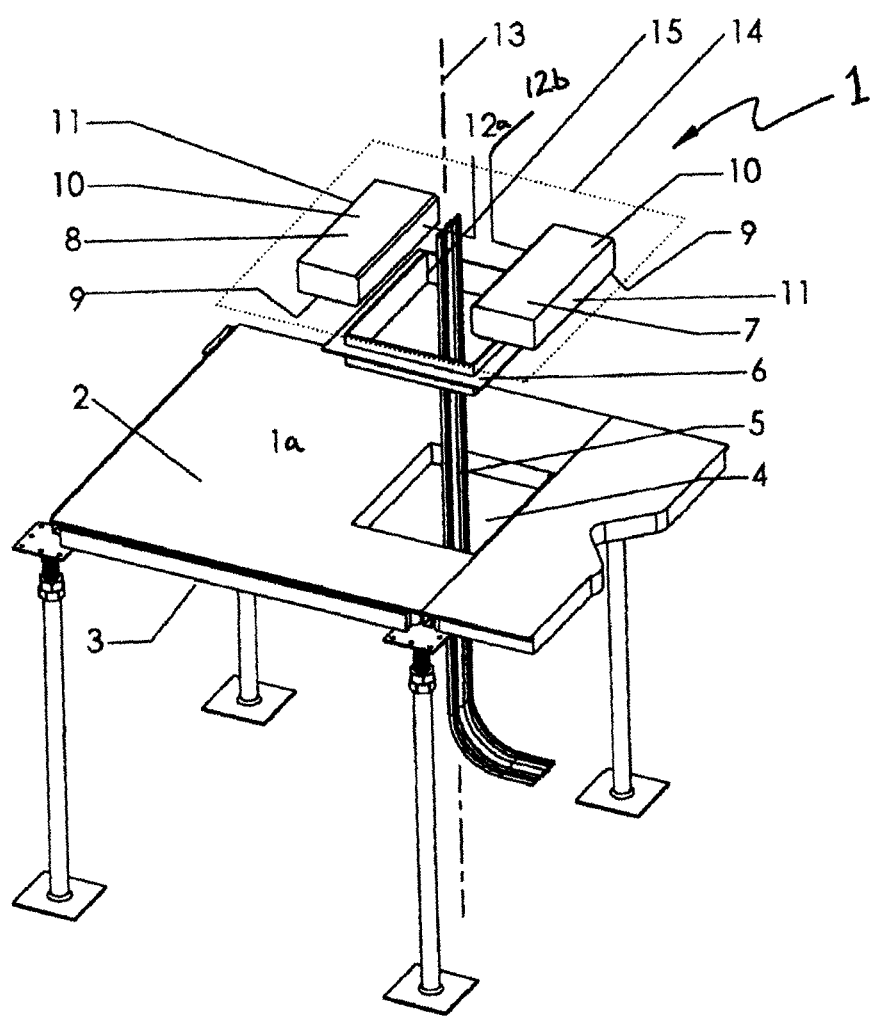
FIG. 1 is a diagrammatic representation of the invention in a typical application, in which a section of a raised access floor has an aperture for services fitted with a seal/grommet.

FIG. 1 is a schematic illustration of a device 1 for providing an air seal, or grommet, embodying the invention in a representative application, in a raised access floor such as may be found in a Data Centre. A barrier 1a, in this example a raised access floor panel, has a front surface 2 and a rear surface 3 (hidden from view). An aperture in the form of a penetration 4 extends through the barrier from the rear surface to the front surface, through which conduits 5 such as cables, optical fibre tubes, or water pipes transit from the rear of the barrier to the front side of the barrier.

An exploded schematic representation of the grommet 1 is shown, in which a surround frame 6, which holds the seal assembly, is fitted over or under and/or into the aperture/penetration 4. The seal assembly comprises first and second opposing seal members in the form of seal segments 7 and 8, which extend across the opening defined by surround-frame 6. Each seal segment has a bottom surface 9 (hidden from view), a top surface 10, perimeter faces 11 and a leading or sealing faces 12a and 12b (hidden from view on seal segment 7).

The seal assembly has a penetration axis 13 passing through the penetration 4 and extending between the rear and the front of the assembly, which is generally parallel to or co-axial with cables, conduits and the like passing through the aperture/penetration 4, and a closure plane 14 perpendicular to said penetration axis and extending across the penetration. The closure plane passes through the seal segments, which move across it to effect opening and closure of the grommet. Conduits which transit through the barrier are enshrouded at a seal interface 15 formed between the sealing faces 12a and 12b on seal segments 7 and 8. For illustrative purposes, in FIG. 1 the sealing faces are shown as simple planar surfaces, but as will be explained later the seal interface is a compound surface.

As the device must seal around services conduits of varying sizes and numbers the sealing elements must be flexible and resilient, to allow conformity to the range of surface contours that may be encountered.

Figure 2:
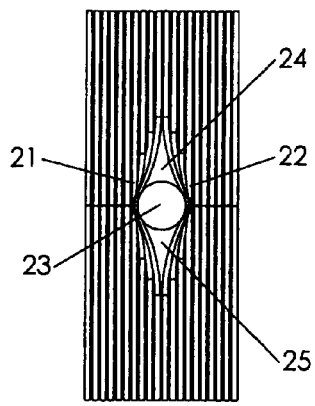
FIG. 2 is a diagrammatic representation of a prior art brush seal.

FIG. 2 is a diagrammatic representation of a known brush-seal of the type disclosed by Sempliner et al, in which cantilevered brush filaments in areas 21 and 22 spread around conduit 23, and largely seal the surrounding area, except for air gaps 24 and 25 which occur where the brushes are parted by the cable.

Figure 3:
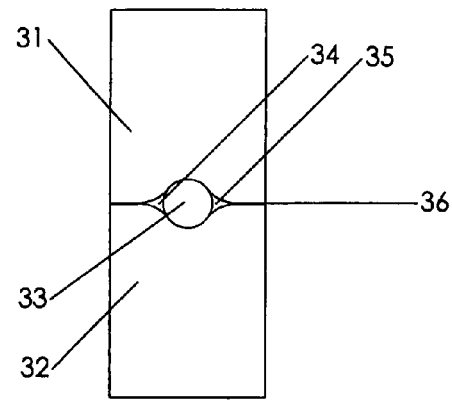
FIG. 3 is a diagrammatic representation of a compressible foam seal.

FIG. 3 is a diagrammatic representation of a plastic cellular foam seal in which seal segments 31 and 32 deform around conduit 33, and largely seal the surrounding area except at gaps 34 and 35 which occur at the seal interface where the foam is stretched between the conduit sheath and seal leading edges 36.

It can be seen that whereas the air gaps in the brush seal form at the split-lines of the brush filaments, behind the seal interface, the air gaps in the foam seal occur at right-angles to this, along the seal interface. Accordingly, in a composite seal comprising brush components and foam components the air gaps in one component will be occluded by the other component, and thus a more complete seal will be created.

Figure 4:
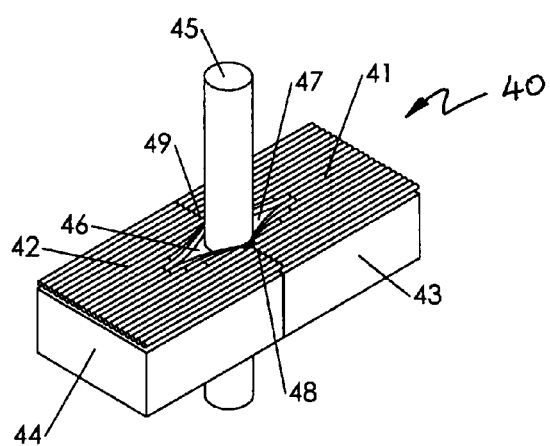
FIG. 4 is a diagrammatic representation of a composite seal construction in which a brush seal is employed in conjunction with a compressible foam seal.

This is illustrated diagrammatically in the seal 40 of FIG. 4 in which brush elements 41 and 42 are aligned so as to press against foam elements 43 and 44, and deform around conduit 45. It can be seen that air-gaps 46 and 47 in the brush elements are occluded by the foam elements, and conversely air-gaps 48 and 49 in the foam elements are occluded by the brush elements. The drawing shows brush seals only on the front face of the seal assembly. In an alternative embodiment a second set of brush seals may be provided on the rear face of the seal assembly.

If brush seals are to resist passage of fire they must be non-combustible. Such filamentary materials may in general be formed from metal wire, or ceramic fibre, or composites such as ceramic fibres encapsulated with polymeric binding agents. However, such fibres are relatively rigid and needle-like, and may penetrate the sheaths of the conduits they are sealing against. In the case of metallic brush fibres enshrouding a plastic cable sheath, this could result in electrically conductive filaments piercing the sheath and contacting the cable core with potentially adverse consequences. Hence it is preferred to use extremely fine conductive filaments to form a "woolly" brush.

Another alternative is to form the seal segments 43 and 44 from a compressible and resilient polymer/plastics material, as is illustrated in FIG. 3, either in combination with brush seals or without such additional brush seals.

Suitable polymer may be polyurethane, epdm, silicone or other suitable compound. The polymer is preferably foamed to enhance compressibility and resilience. In order to achieve fire resistance it may include fire-retardant additives or ceramifying additives which have the property of reacting at high temperatures (in the order of 400° C. and above) to form a non-combustible ceramic material which will insulate the interior of the seal body and thereby prevent further combustion. Such materials are described at, for example, http://www.cerampolymerik.com/. Examples of such compositions are also described in International patent application No WO2005/095545 entitled "Ceramifying composition for fire protection" in the name of Olex Holdings Pty Ltd, the entire contents of which are incorporated herein by reference.

Ceramifying additives as described in WO2005/095545 typically include combinations of inorganic phosphate and silicate mineral fibre. More specifically the ceramifying composition for forming a fire resistant ceramic under fire conditions may comprise, at least 10%, preferably at least 15%, by weight of silicate mineral fibre, from 8% to 15% by weight of at least one inorganic phosphate that forms a liquid phase at a temperature of no more than 800° C. selected from ammonium phosphate, ammonium polyphosphate and ammonium pyrophosphate, and at least 15% by weight based on the total weight of the composition of a polymer base composition comprising at least 50% by weight of an organic polymer, the composition forming a self supporting ceramic on exposure to an elevated temperature of 1000° C. for a period of 30 minutes.

Table 1 of WO2005/095545 on page 28 sets out compositions A, B, C, D which transform into hard and strong ceramics at elevated temperatures. Table 2 on page 29 sets out another suitable composition E, and table 3 on page 30 sets out compositions F to N, with O and P being comparative examples.

Particular reference is made to example 11 on page 42 of WO2005/095545 which sets out the preparation of polyurethane foams AH and AI incorporating ceramifying components which may be suitable as a foam for use in making a seal/grommet embodying the present invention.

The polymer may also incorporate electrically conductive additives to dissipate static electricity, such as carbon black, carbon fibres, metals or the like The polymer may also incorporate intumescent additives that in a fire will cause the seal segments to expand and more tightly enshroud the conduit sheaths, such as exfoliating graphite. This may be useful in countering the effects of ageing and consequent long-term deformation of the seal interface.

As FIG. 3 illustrates, a simple two-part seal formed from segments 31 and 32 will not completely envelop a transiting conduit 33 but will leave gaps 34, 35 where the seal surfaces stretch between the seal interface 36 and the surface of the conduit. These passages allow hot gas and flames to pass through the seal, which may cause the conduit sheath to melt and the seal to degrade and shrink, thus opening up the passage further and leading to early failure of the seal.

The sealing faces can be made to adapt better to the cables and conduits passing through the aperture by forming the faces as a series of fingers. One such configuration is illustrated in the seal 50 of FIG. 5, which depicts an exploded view of a seal comprising sealing member/segments 51, 52 in which the sealing faces have a series of vertically aligned convolutions that form contiguous fingers 53, 54. FIG. 5*a* depicts this seal enclosing a conduit 55, in which the fingers are perpendicular to the seal interface and extend from the body of the seal-segment to the leading face. The interstitial faces of the fingers may be perpendicular to the said front and rear seal faces, as shown in this drawing, or they may be at some other angle, but in general they extend from the rear to the front of the seal. As the seal segments are pressed together and compress around the conduit, the fingers 56, 57 deform independently and thus provide a closer conformity of the seal to the surface of the conduit.

FIGS. 6 and 6*a* show one means of fabricating such a grommet 60, in which seal member/segment 62 is moulded with a split-line 63 and in an expanded state with gaps 65 occurring between fingers 64. The frame 61 of the grommet is smaller than the seal-segment, so when the seal-segment is inserted into the frame as shown in FIG. 6*a*, the fingers are compressed against each other, causing the gaps 65 to close up, and also push the mating face 64 forward so that it will be maintained in tight contact at the seal interface.

FIGS. 5, 5*a*, and 6 and 6*a* illustrate a grommet consisting of two rectangular segments, but other configurations are possible and these may confer particular advantages. For example the grommet may comprise only one segment, such as the construction shown in FIG. 6*a*, but arranged to press against a side wall or other surface.

FIGS. 7 and 7*a* illustrate a cylindrical or semi-cylindrical grommet 70 with a central conduit passage. FIG. 7 illustrates a seal segment moulded from a flexible foam material in which fingers 71 project inwards from outer edge 73. This seal segment is fitted into semi-circular frame segment 74, and as a result the gaps 72 between the fingers 71 are closed, and the seal segment forms a flat sealing interface 75 that will bear against an opposing seal segment or an edge-wall. Such a seal construction will provide improved adaptability to a conduit passing through the penetration zone 76.

Alternatively as shown in FIG. 7b the seal may be formed from one or more seal elements 77 that wrap through 360 degrees around the conduit.

The surround frame may in either case be formed from segments as shown or as a single cylindrical element.

An alternative means to effectively enshroud conduits of varying size and number is to provide the leading edges of each seal segment with a brush consisting of an array of flexible resilient bristles. This seal 80 is illustrated in FIG. 8, in which seal segments 81, 82 have leading edges 83 and 84 surfaced with brushes 85 and 86. Such brushes may comprise an array of flexible resilient bristles in the order of 2 to 6 mm in length, supported for example on a woven mat that is adhered to the leading surfaces of the seal segments.

FIG. 8 shows a construction with simple rectangular seal segments, however the brush seals shown here may also be applied to convoluted seal surfaces similar to the leading surfaces of seal segments shown in for example FIG. 6 or FIG. 7, or to constructions described below.

The addition of ceramifying additives to polymeric seal elements considerably improves their performance in a fire, but if flame and hot gases can pass through gaps between the seal elements, that will lead to early failure of the seal. We have observed however that if the interstitial gaps can be minimized the rear of the seal will remain cool, and the seal material will retain its elasticity and press against the softened conduit sheath, thereby compressing it and closing off any gaps that would otherwise develop. This mechanism is ineffective in a grommet with a simple flat-surfaced sealing interface because the gaps at either side of the conduit (eg gaps 34, 35 in FIG. 3) are too large to prevent the passage of hot gas and flame.

Figure 9:
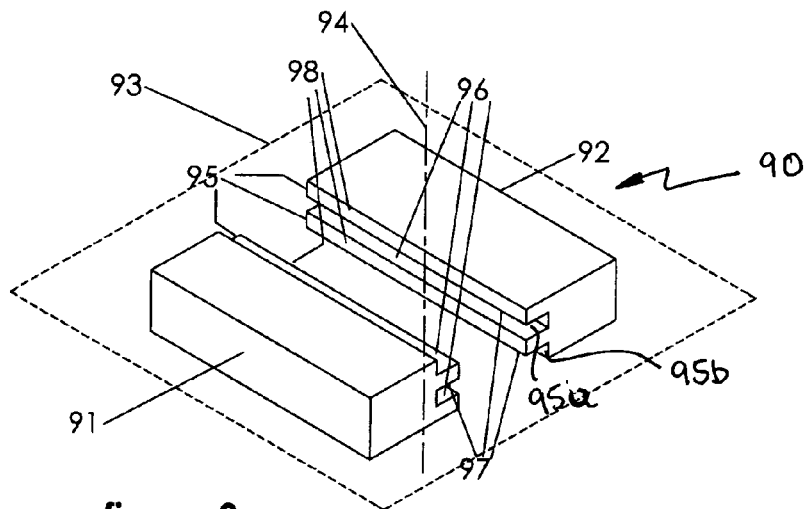
FIG. 9 is an exploded view of a compressible foam seal in which each segment has a series of ribs extending lengthways along the sealing face and which engage into and against the opposing segment.

One means to overcome this problem is to form the leading faces of the seal segments with one or more longitudinal tongues extending lengthways along the sealing interface. This is illustrated in FIG. 9, which is an exploded view of a two-part seal assembly 90 in which opposing sealing members/segments 91 and 92, located on closure plane 93 and oriented towards penetration axis 94, have longitudinal protrusions in the form of tongues 95 on their leading edges. A recess 95a is defined between each pair on tongues. Edge recesses 96b are located on one side of one tongue and the bottom or top face of the sealing member.

Lateral surfaces 96 of the tongues face upwards, towards the top/front of the barrier, and are substantially parallel to the closure plane; and lateral surfaces 97 on the opposite sides of the tongues (concealed in this view) are also parallel to said closure plane but face downwards, toward the rear of the barrier. The leading faces 98 on each seal segment (concealed on segment 91) are shown here as flat surfaces generally parallel with the penetration axis, but they may for example be tapered, have chamfered or rounded corners, or have a semi-circular profile.

The seal segments are disposed such that on each of the tongues the front-facing surface 96 is substantially co-planar with the corresponding rear-facing surface 97 on the opposing seal segment. Accordingly when the opposing seal segments are moved towards closure of the grommet the opposing tongues will engage in sliding contact along their opposing side surfaces in the recesses 95a and 95b, and will thereby form a multi-faceted seal in the form of a stepped sealing interface. This produces a convolute labyrinthine seal which inhibits the flow of air therethrough.

Figure 10:
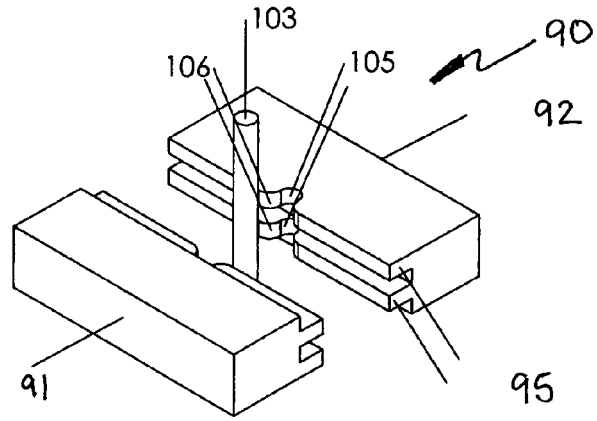
FIG. 10 is an exploded view of seal as depicted in FIG. 14, showing how the seal-segments compress and conform around a typical conduit.

FIG. 10 is an exploded view of such a grommet 90, illustrating the formation of a seal around a conduit. When the seal segments 91 and 92 are enclosed against conduit 103, each segment compresses around the surface of the conduit in the manner previously shown in FIG. 3. As depicted on seal segment 92, the projecting tongues 95 compress around the conduit sheath, forming contact surfaces 105 and beside them interstitial gaps 106, which occur between the conduit sheath and the leading faces of the tongues.

Figure 10A:
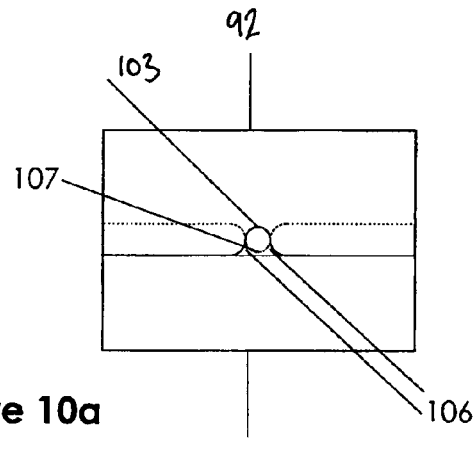
FIG. 10a is a top view of the said seal and conduit.

It will be seen that if the seal material is sufficiently soft and resilient, it will wrap around the conduit, and these gaps will form forward of the conduit centre-line. Accordingly as the seal segments are brought together to full closure and the tongues interlock, the interstitial gaps on the tongues of seal-segment 91 are occluded by the tongues of seal-segment 92, and vice versa. This is further illustrated in FIG. 10a, which shows a top-view of the seal assembly in fully closed position. In this, the tongues on seal-segment 91 deform along curve 106, and the tongues on seal-segment 92 deform along curve 108, and as a result of the interlocking of the tongues, the interstitial gaps on seal segment 92 are occluded by seal segment 91, and a virtually complete seal is formed around the surface of the conduit.

It will be noted that the two seal-segments 91 and 92 are identical in shape. This is not essential, but it is advantageous in simplifying manufacture, installation and operation of the grommet.

A number of techniques may be employed during manufacture to enhance the efficiency of the seal mechanism.

The cellular seal-segment may be formed with deep skin on upper and lower faces and with shallow skin or trimmed-off skin to enhance flexibility on the sealing faces.

The seal segment may consist of a relatively robust core with sealing surfaces formed from a relatively flexible and resilient material such as low-density cellular polymer or brushes.

The fire-retardants and/or ceramifying additives may be encouraged to aggregate on the front and rear faces to improve durability of the face exposed to the fire.

The seal segments may be formed as a single moulding with dense skin but cut in half to form soft sealing faces.

It will be appreciated that whereas FIG. 10 shows two seal-segments with two tongues on each segment, this is by way of example only. It is noted though that the provision of two tongues on each seal element will ensure that the opposing tongue is secured laterally and will thus maintain a continuous seal on each side face.

Figures 11, 11A:
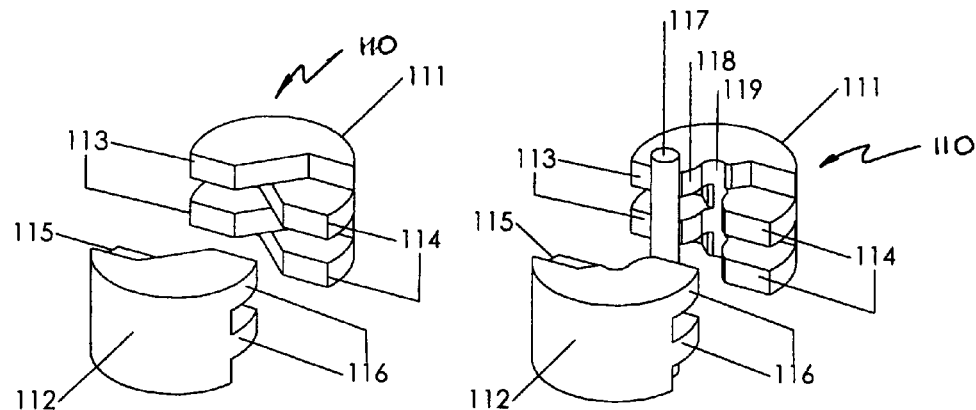
FIG. 11 is an exploded view of a seal assembly in which each seal segment is a half-cylinder, and the interlocking tongues are in alternating layers.
FIG. 11a is an exploded view of the same seal assembly showing how the seal-segments compress and conform around a conduit.

The sealing members may be shapes other than rectangular. For example, FIGS. 11 and 11a illustrate an arrangement in which the seal-segments form a cylindrical seal assembly. This has the advantage that it will facilitate the seal assembly being inserted directly into a circular hole in the barrier such as may be formed in situ with a hole-saw.

In FIGS. 11 and 11a, the seal-assembly 110 is formed from opposing semi-cylindrical seal-segments 111 and 112. As illustrated here, it is advantageous that the seal-segments are identical. Seal-segment 111 has tongues 113 that are interleaved with tongues 114, and seal-segment 112 has tongues 115 that are interleaved with tongues 116. As with the devices in FIGS. 9 and 10, when the seal-segments are moved towards closure of the seal-assembly the opposing tongues engage in sliding contact and thereby effect a convolute seal.

As illustrated in FIG. 11a, a conduit 117 passing through the central area of the seal-assembly will cause each seal-segment to compress and deform around the conduit sheath. For example, central area 119 will compress against and around the conduit sheath, and tongues 113 will stretch and deform at areas 118, but as the seal assembly closes the opposing tongues 115 will occlude the gap formed at areas 118 and thus effect a continuous seal around the conduit sheath. Although typically the seals do not require profiled faces defining pre-formed recesses for receiving specific conduits and cables, it can be advantageous to provide such pre-formed recesses, particularly for larger diameter conduits.

This construction is particularly suited to situations where a conduit such as a water pipe passes through a wall or floor slab. Typically the hole is cored through the wall or floor, and the conduit, which is typically quite large in relation to the core hole, is fitted and fastened to the surrounding structure. It is rare however that the conduit is concentric with the core hole, so a grommet is required that can provide a continuous seal between the conduit and the barrier but which can adapt to a displacement of the conduit from the centre of the core hole. As discussed above, to accommodate larger conduits such as water pipes it is advantageous to pre-form a semi-cylindrical recess in the region of central area 119 that is smaller than the expected conduit size, in order to optimise the degree of compression of the seal material around the conduit.

Figure 12:
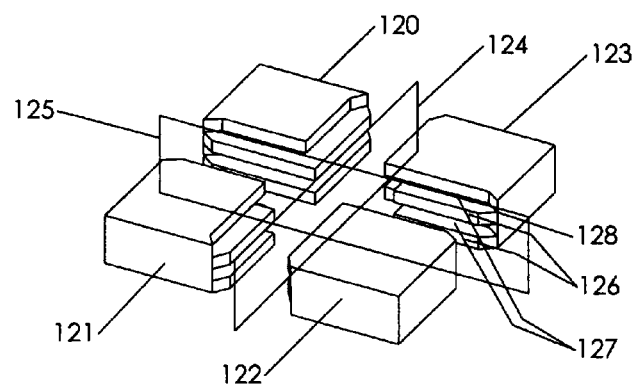
FIG. 12 is an exploded view of a seal assembly having four seal segments.

The seal assembly may comprise more than two seal segments, and the longitudinal tongues need not have a constant cross-section. FIG. 12 illustrates a seal assembly comprising four segments 120, 121, 122, and 123 and having two sealing interface planes 124 and 125, and in which each seal element has two sets of tongues, one on each interface. The elements are shown as rectangular but they could be formed as quadrants.

The use of more than two seal segments may confer advantages including greater adaptability to varying conduit sizes and numbers.

As best seen on seal-segment 123, the leading faces of tongues 126 and adjacent grooves 127 taper to a common edge 128. This will allow adjacent seal-segments to be moulded as a single element, and hinged along edge 128.

Figure 13:
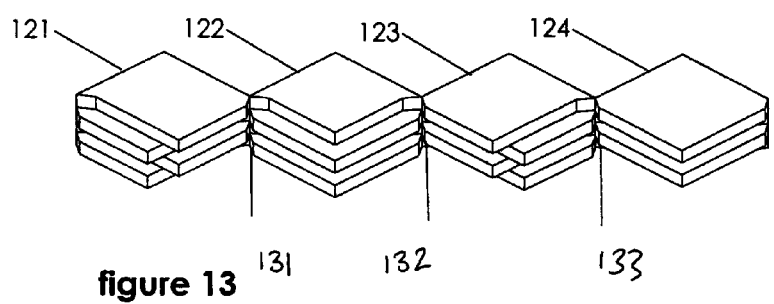
FIG. 13 is a view of a seal component comprising a unitary moulding of a four-segment seal incorporating segments similar to those depicted in FIG. 12.

Such an arrangement is illustrated in FIG. 13 in which the four seal elements 121, 122, 123 and 124 are formed as a unitary moulding with integral hinges 131, 132 and 133 connecting the said elements. In use the seal assembly is wrapped around the conduit or conduits passing through the barrier, and then inserted into a grommet frame or performed penetration, not shown.

It should be noted that it is not necessary to form the seal assembly as a single moulding; for example the seal assembly could be formed as two seal segments, each comprising two seal elements connected along the hinge line.

Figure 14:
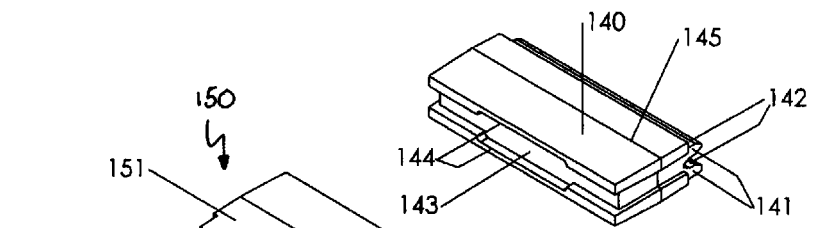
FIG. 14 is an isometric projection of a preferred seal segment.

One preferred seal segment is illustrated in FIG. 14. This depicts a sealing member/segment 140 which is manufactured from a compressible elastic material such as foamed polyurethane, and which may have ceramifying additives and/or fire-retardants and/or intumescent additives and/or electrically conductive additives incorporated into the base material. The leading edge has two longitudinally extending tongues 141 and two adjacent recesses 142. These are configured such that when two of these said sealing members are interlocked, the front and rear faces of each member will align and each pair of tongues will fit snugly into the corresponding recess on the opposing seal member.

The perimeter has a recess 143 extending around all three edges to provide a means for retaining the seal segment in the grommet. On the trailing edge the recess is widened to form cavities 144, which serve as finger recesses to assist removal and replacement of the sealing member in the grommet. The part is moulded, and has a split-line 145 allowing the moulding die to be a simple two-part tool opening in line of draw.

Figure 15A:
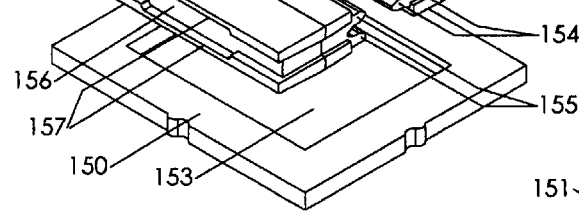
FIG. 15a is an exploded isometric projection of a grommet arrangement in which the seal assembly mounts directly into the barrier penetration.
Figure 15B:
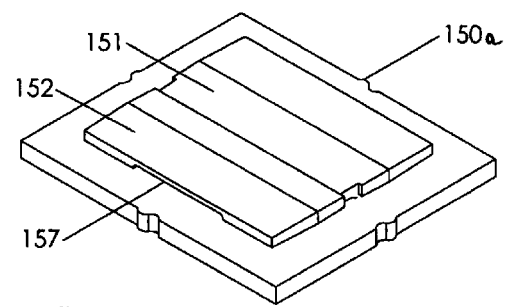
FIG. 15b is an isometric projection of the same grommet, in the closed position.

FIGS. 15a and 15b depict a grommet assembly 150 incorporating a pair of such sealing members 140, in which sealing members 151 and 152 fit directly into a penetration 153 in barrier 150a. FIG. 15a shows an exploded view of the assembly and FIG. 15b shows the seal elements fitted into the barrier penetration and forming an enclosure. Seal segment 151 has two longitudinally extending tongues 154 that engage with tongues 155 on seal element 152 to create a convolute seal interface capable of conforming around transiting conduit sheaths, which may vary in size and number. The perimeter recesses 156 are dimensioned to provide a close fit against the perimeter of the barrier penetration 153, and they are of similar width to the thickness of the barrier so as to facilitate a comprehensive engagement against the perimeter of the penetration 153. Finger-grip recesses 157 extending off the perimeter recesses facilitate removal and replacement of the seal elements.

Figure 16A:
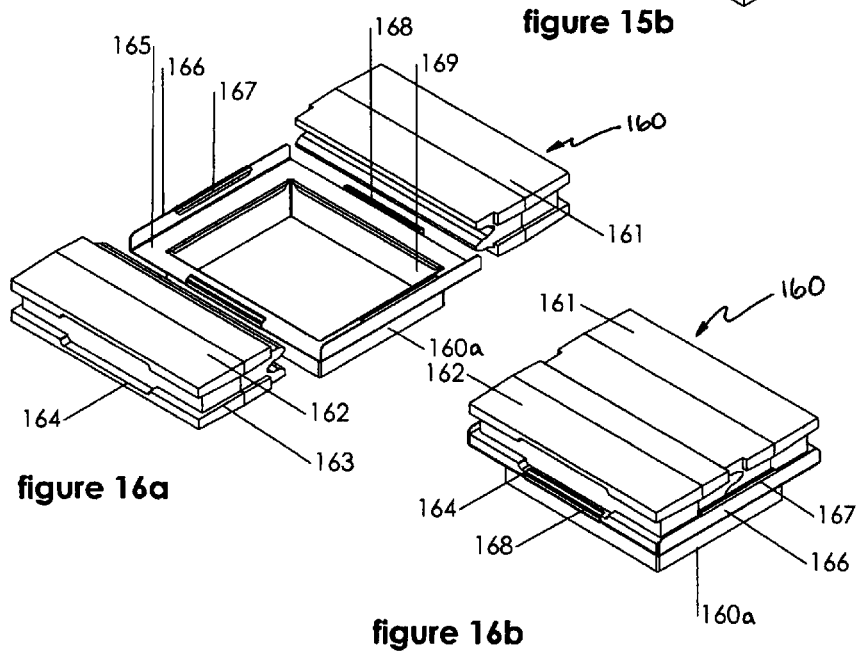
FIG. 16a is an exploded isometric projection of a grommet in which the seal assembly is held within a surround frame that mounts over and/or within the barrier penetration.
Figure 16B:
FIG. 16b is an isometric projection of the same grommet, in the closed position.

FIGS. 16a and 16b depict an alternative grommet assembly 160 in which identical seal elements 161 and 162 are carried by a frame 160a which is mounted onto the barrier and fits over or into the penetration. FIG. 16a is an exploded view of the grommet assembly and FIG. 16b is a view of the assembly with the seal elements in position in the grommet frame and forming an enclosure.

Grommet frame 160a has a horizontal flange element 165 designed to bear against the surface of the barrier, and an inner sleeve 169 designed to fit into the barrier penetration. The frame has vertically extending side edges 166 that laterally restrain the seal elements, and returns 167 that engage around the perimeter edges 163 on seal elements 161 and 162 which thereby press the sealing members against the face of the flange. The flange also has vertically extending restraints 168 that engage around the finger recesses 164 of the sealing members, and thereby restrain the trailing edges of the seal elements from deflecting upwards or parting along the seal interface.

Figure 17A:
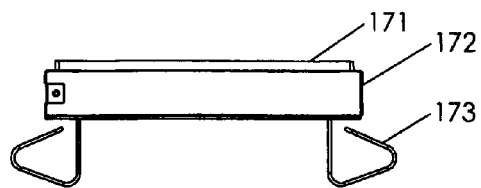
FIG. 17a is a side view of an alternative preferred grommet in which the seal assembly is supported within a demountable frame.
Figure 17B:
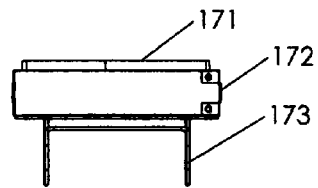
FIG. 17b is an end view of the grommet.
Figure 17C:
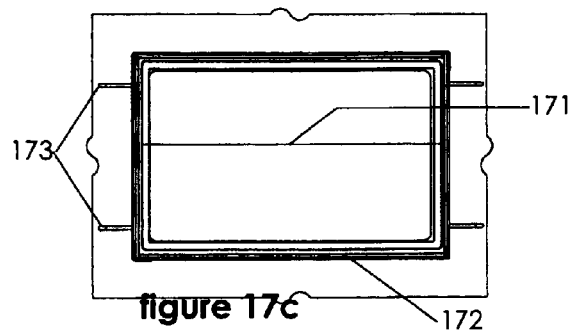
FIG. 17c is a top view of the grommet.
Figure 17D:
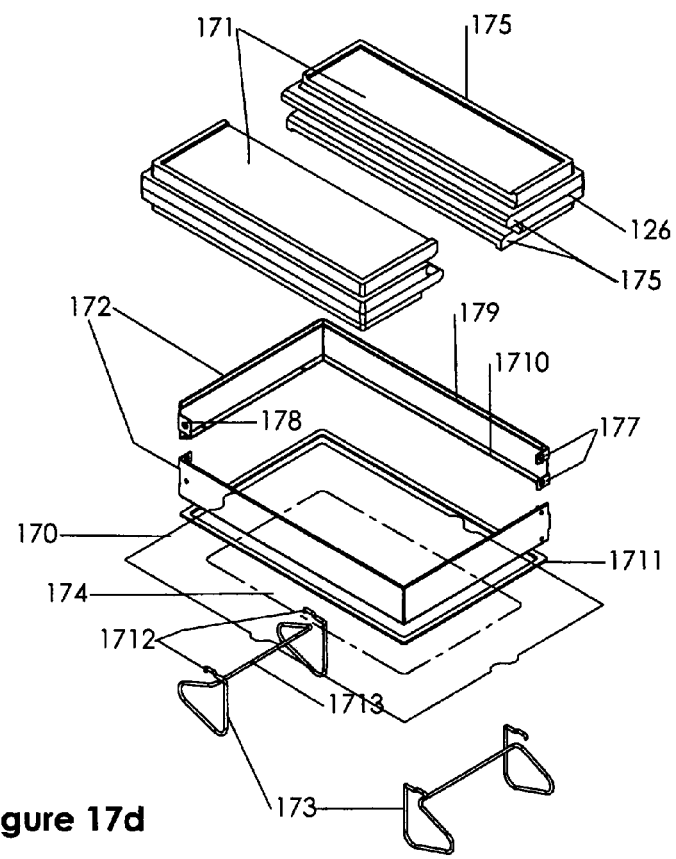
FIG. 17d is an exploded isometric projection of the grommet assembly.

FIGS. 17a-17d illustrate another preferred grommet construction. FIG. 17a is a side view, FIG. 17b is an end view, FIG. 17c is a top view and FIG. 17d is an exploded isometric projection.

This grommet has a seal assembly 171 supported in a frame 172 which in use is mounted over a penetration 174 in a barrier 170 and which is held in place with spring clamps 173.

The seal assembly 171 comprises two identical sealing members, manufactured as foamed polymer mouldings that may incorporate fire-retardant additives, ceramifying additives and/or intumescent additives and/or electrically conductive additives and/or sound deadening additives such as Barium Sulphate. Each sealing member has two longitudinally extending tongues on its leading edge that are configured so as to form a close-fitting convolute seal interface when the seal segments are interlocked and brought towards full closure. Each sealing member has a projecting rib 175 around the perimeter of its side faces that compresses against the barrier and thus creates a continuous seal around the penetration when the seal assembly is in place.

Each sealing member also has a projection 176 around its perimeter edges which engages against the grommet frame and presses the seal against the barrier. The height of projection 176 is kept as low as possible in order to minimise the angle through which the sealing member must be rotated as it is inserted into the grommet frame and engaged into the opposing sealing member.

The grommet frame 172 consists of two identical frame segments that can be assembled in-situ and so allow it to be fitted around existing cables (or conduits generally), thereby avoiding the need to disconnect and re-thread the cables through the grommet frame. To facilitate assembly, each frame segment has tabs 177 and 178 that engage around the opposing frame segment at the two opposite corners. To facilitate connection of the two segments tab 178 is initially flat, and when positioned is folded against the side wall of the opposing frame segment. Holes may be provided in each tab and frame side wall to facilitate screw fastening, and/or the tabs may be fastened with high-bond adhesive.

Each frame segment has a doubly folded flange 179 on its upper edges that engages against projections 176 on the seal segments to hold them in position against the face of the barrier. A second flange 1710 on the lower edges of each frame segment provides stiffening of the frame and may carry an optional strip-seal 1710 that provides a secondary seal between the barrier and the grommet assembly.

Each spring clamp 173 has upper clips 1712 that engage over flange 1710 in the frame assembly, and a lower contact strip 1713 that engages against the underside of the barrier. The spring section is folded back on itself so as to position the lower contact strip immediately beneath the upper clips and thus ensure that the clamping force is generally perpendicular to the frame base and the barrier. The lower contact strip should preferably be in the order of 100 mm minimum length to ensure that the clip bridges between undulations on the underside of the barrier.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. A device for providing an air seal or partial air seal of an aperture through which one or more cables or conduits may pass, the device comprising:
   at least first and second opposing sealing members, the first sealing member defining a first sealing face and the second sealing member defining a second sealing face opposing the first sealing face, at least one of the sealing members being movable between a position in which the aperture is substantially closed and a position in which the aperture is substantially open;
   wherein the sealing members comprise a resilient flexible compressible foamed plastics or polymeric material; and
   wherein the first sealing face defines at least one elongate recess extending along the face having at least one side wall and wherein the second sealing face defines a protrusion in the form of a tongue having side faces arranged to locate in the recess when the first and second sealing faces are engaged together, the arrangement being such that the sealing members provide a substantial air seal across the frame opening in use with at least one side face of the tongue abutting and overlapping the at least one side wall of the recess, said resilient flexible compressible foamed plastics or polymeric material forming the sealing members deforming and conforming around any cables or conduits extending through the frame.

2. A device as claimed in claim 1 including a frame for lining the aperture having a frame opening in which the two opposing sealing members are mounted.

3. A device as claimed in claim 1 wherein the recess is in the form of a channel.

4. A device as claimed in claim 3 wherein the first sealing face in which the recess is located defines two substantially co-planar or parallel surfaces, the surfaces being located on either side of the recess and being substantially free from pre-formed recesses for receiving cables.

5. A device as claimed in claim 4 wherein the second sealing face defines a second protrusion which defines a second surface facing the first sealing member which is co-planar with the first surface, and wherein an edge recess is defined in the first sealing face opposing the second protrusion for receiving the second protrusion when the first and second sealing faces are engaged together.

6. A device as claimed in claim 1 wherein the recess is an edge recess.

7. A device as claimed in claim 1 wherein the protrusion defines a first surface facing the first sealing member which is planar and which is substantially free from pre-formed recesses for receiving cables.

8. A device as claimed in claim 1 wherein the protrusion defines a first surface facing the first sealing member which is planar and includes at least one pre-formed recess for receiving a pipe or conduit.

9. A device as claimed in claim 1 wherein the foamed plastics or polymeric material includes a component that transforms into a ceramic material at a temperature above an activation temperature.

10. A device as claimed in claim 1 wherein the foamed plastics or polymeric material includes a component that expands or swells at a temperature above an activation temperature.

11. A device as claimed in claim 1 wherein the sealing members define an upper surface which is generally perpendicular to the surface at which the sealing elements engage and which have a relatively thicker skin than the sealing faces of the opposing sealing members.

12. A device as claimed in claim 1 wherein each sealing element defines three perimeter edges which abut the frame and wherein the perimeter edges define a projection which engages against the interior of the frame and presses the sealing members against the frame.

13. A device as claimed in claim 12 wherein the frame defines spring loaded clamps for attaching the frame to an aperture in a floor, sub-floor, wall, or ceiling.

* * * * *